US010777267B2

(12) United States Patent
Li et al.

(10) Patent No.: US 10,777,267 B2
(45) Date of Patent: Sep. 15, 2020

(54) HIGH SPEED THIN FILM TWO TERMINAL RESISTIVE MEMORY

(71) Applicant: International Business Machines Corporation

(72) Inventors: Ning Li, Armonk, NY (US); Devendra Sadana, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/864,148

(22) Filed: Jan. 8, 2018

(65) Prior Publication Data

US 2019/0214080 A1    Jul. 11, 2019

(51) Int. Cl.
| | |
|---|---|
| *G11C 13/00* | (2006.01) |
| *H01M 10/0562* | (2010.01) |
| *H01M 10/0585* | (2010.01) |
| *H01M 2/16* | (2006.01) |
| *H01M 4/131* | (2010.01) |
| *H01M 4/525* | (2010.01) |

(52) U.S. Cl.
CPC ...... *G11C 13/0009* (2013.01); *G11C 13/0069* (2013.01); *G11C 2213/30* (2013.01); *H01M 2/1646* (2013.01); *H01M 4/131* (2013.01); *H01M 4/525* (2013.01); *H01M 10/0562* (2013.01); *H01M 2300/0071* (2013.01)

(58) Field of Classification Search
CPC ............ G11C 13/0009; G11C 13/0069; G11C 2213/30; H01M 2/1646; H01M 4/131; H01M 4/525; H01M 10/0562; H01M 2300/0071
USPC .................................................. 365/107, 148
See application file for complete search history.

(56) References Cited

U.S. PATENT DOCUMENTS

| | | | |
|---|---|---|---|
| 2,967,807 A | * | 1/1961 | Miller ....................... C25B 1/36 204/266 |
| 6,473,332 B1 | | 10/2002 | Ignatiev et al. |
| 6,849,891 B1 | | 2/2005 | Hsu et al. |
| 6,864,522 B2 | | 3/2005 | Krieger et al. |
| 2004/0185667 A1 | | 9/2004 | Jenson |
| 2008/0043515 A1 | | 2/2008 | Bloch |
| 2010/0003600 A1 | | 1/2010 | Niessen et al. |
| 2011/0149634 A1 | | 6/2011 | Schloss et al. |
| 2011/0182103 A1 | | 7/2011 | Smythe et al. |

(Continued)

OTHER PUBLICATIONS

Paul J. Otterstedt, List of IBM Patents or Patent Applications Treated As Related, Oct. 9, 2019, pp. 1-2.

*Primary Examiner* — Ly D Pham
(74) *Attorney, Agent, or Firm* — Daniel Morris; Otterstedt, Wallace & Kammer, LLP

(57) ABSTRACT

A battery article of manufacture comprises a plurality of components operatively associated with one another, the plurality of components comprising an electrode comprised of a material that can take up ions and discharge ions in a charging and discharging process, an electrolyte comprised of the ions, the article of manufacture also including a component comprising at least one barrier positioned between the electrolyte and the electrode, the barrier comprised of a material that substantially prevents the ions from combining with the electrode and having a structure that substantially prevents the ions from combining with the electrode, but allows the ions to travel toward or away from the electrode in the charging or discharging process.

25 Claims, 8 Drawing Sheets

(56) References Cited

U.S. PATENT DOCUMENTS

| | | |
|---|---|---|
| 2012/0126195 A1 | 5/2012 | Ignatiev et al. |
| 2012/0127779 A1 | 5/2012 | Scheuerlein et al. |
| 2012/0168705 A1 | 7/2012 | Liu et al. |
| 2012/0205606 A1 | 8/2012 | Lee et al. |
| 2015/0079481 A1 | 3/2015 | Sun et al. |
| 2015/0280219 A1* | 10/2015 | Xiao ............... H01M 4/366 429/231.8 |
| 2016/0071565 A1 | 3/2016 | Lemke |
| 2016/0141598 A1* | 5/2016 | Dai ............... H01M 4/0452 205/317 |
| 2017/0149093 A1* | 5/2017 | Sun ............... H01M 10/0585 |
| 2017/0162859 A1* | 6/2017 | Yang ............... H01M 4/38 |
| 2018/0159133 A1* | 6/2018 | Schoo ............... H01M 10/0436 |
| 2018/0205089 A1* | 7/2018 | Unnikrishnan ..... H01M 4/0404 |
| 2018/0309106 A1* | 10/2018 | Channu ............... C08L 27/16 |
| 2018/0375100 A1* | 12/2018 | Haverkate ............... H01M 4/04 |
| 2019/0013518 A1* | 1/2019 | Croy ............... H01M 4/485 |
| 2019/0088971 A1* | 3/2019 | Koplow ............... H01M 8/0202 |
| 2019/0214081 A1 | 7/2019 | Li et al. |
| 2019/0214082 A1 | 7/2019 | Li et al. |

\* cited by examiner

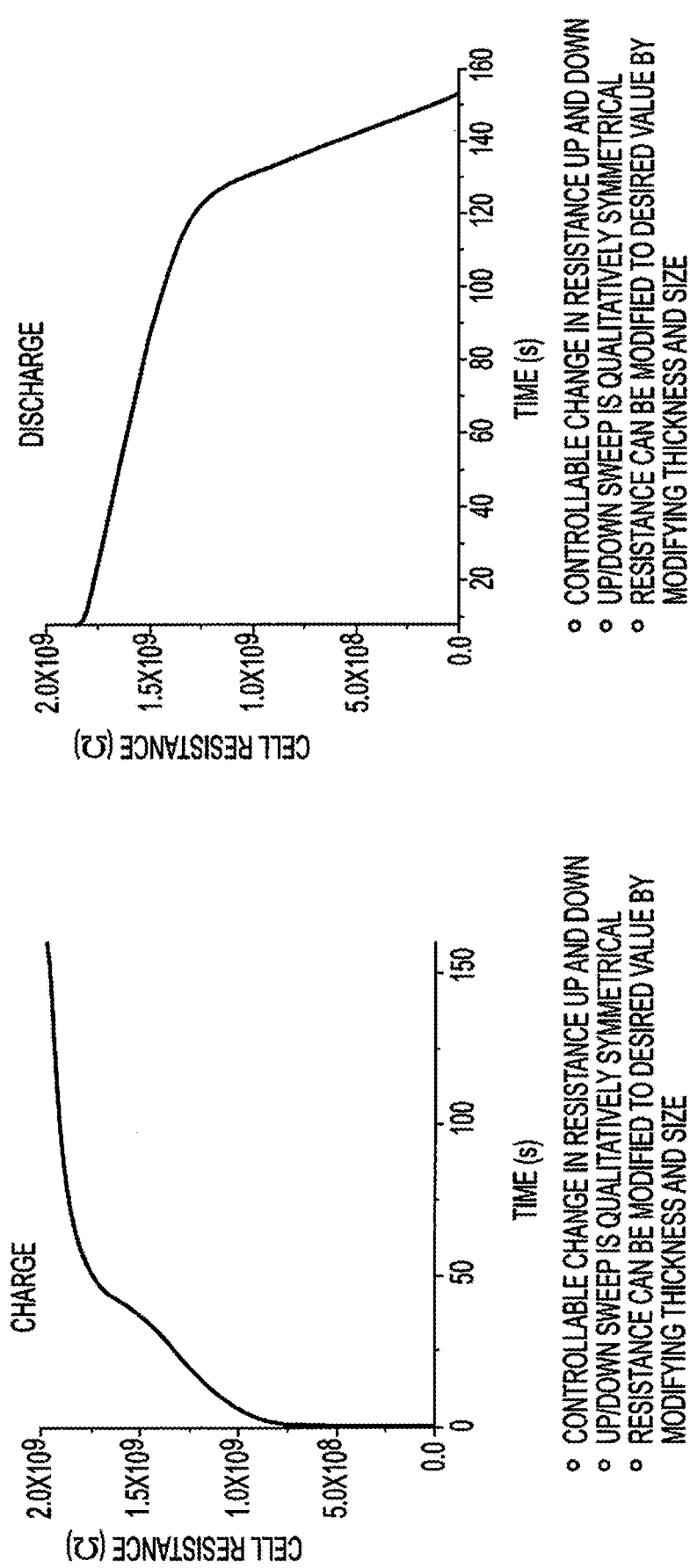

SPEED CONSIDERATION
(DIELECTRIC RELAXATION TIME)

DIELECTRIC RELAXATION TIME IN LiPON $\tau = \varepsilon \varepsilon_0 / \sigma$
= 16.6*8.85e-14F/cm/(2E-6S/cm)
= 7E-7sec
= 0.7usec BEST ELECTROLYTE IS 3-4 ORDERS OF MAGNITUDE MORE CONDUCTIVE THAN LiPON
$\tau \sim 0.1ns$

DIELECTRIC RELAXATION TIME IN LCO $\tau = \varepsilon \varepsilon_0 / \sigma$
= 13.2*8.85e-14F/cm/(2E-2S/cm)
~10ps

LITHIUM DIFFUSIVITY:

LiPON: 1E-11cm²/s

LCO: 1E-12~1E-11cm²/s
1E-7 cm2/s FOR SINGLE CRYSTAL

IONIC CONDUCTIVITY:

LiPON: 2E-6 S/cm

LCO: 2E-2 S/cm
5E+1 S/cm FOR SINGLE CRYSTAL

*FIG. 6*

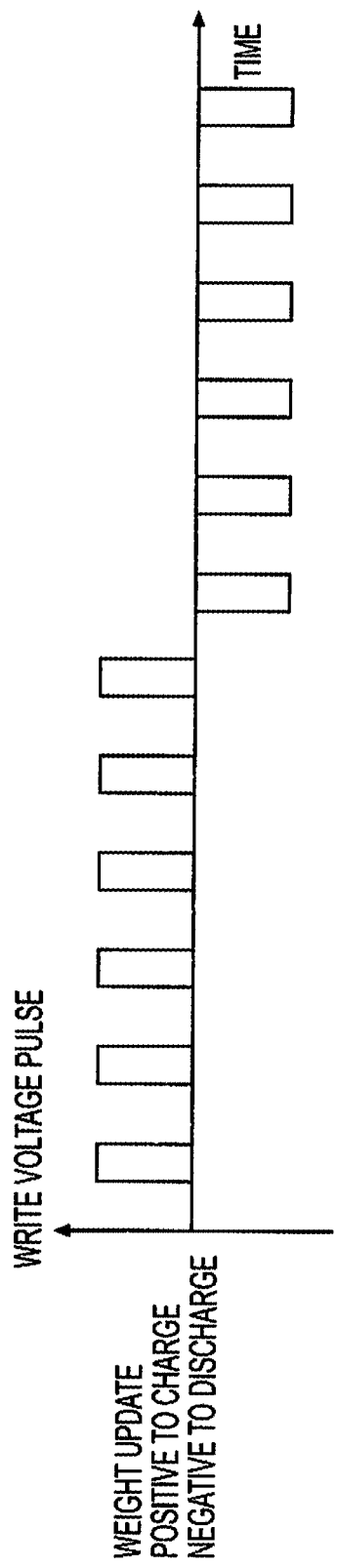
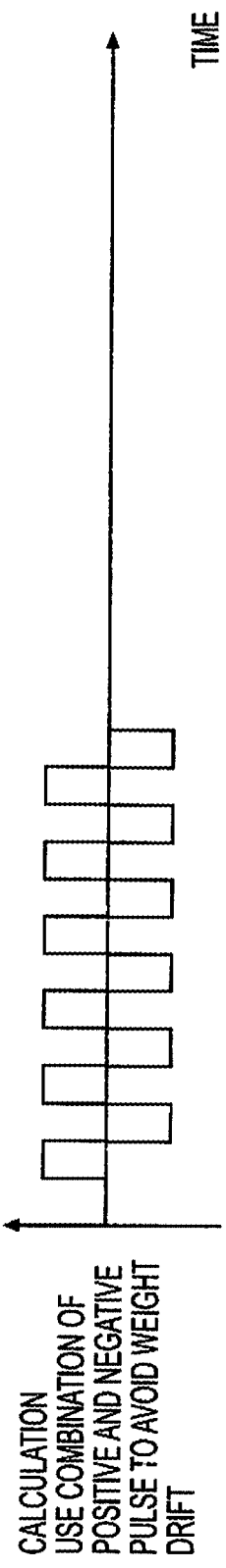
FIG. 7

HIGH SPEED THIN FILM TWO TERMINAL RESISTIVE MEMORY

FIELD OF THE INVENTION

The field of the invention comprises high speed resistive memory battery articles of manufacture based on chargeable and dischargeable variable resistance thin film batteries used in memory computer circuits such as neuromorphic computer circuits and processes of using these batteries.

BACKGROUND OF THE INVENTION

There are two major categories of computer memory: non-volatile memory and volatile memory. Non-volatile memory does not require constant input of energy in order to retain information whereas volatile memory does. In non-volatile memory devices, the memory state can be retained for days to decades without power consumption. Examples of non-volatile memory devices comprise Read Only Memory (ROM), Flash Electrical Erasable Read Only Memory, Ferroelectric Random Access Memory (FRAM), Magnetic Random Access Memory (MRAM), and Phase Change Memory.

Examples of volatile memory devices comprise Dynamic Random Access Memory (DRAM) and Static Random Access Memory (SRAM), however with the disadvantages that, DRAM requires the memory element to be constantly refreshed while SRAM requires a constant supply of energy to maintain the state of the memory element.

Memory cells that employ formation of dendrites, however, are not problem free. Kozicki, et al., U.S. Pat. No. 5,761,115, disclose a PMC memory cell structure (Programmable Metallization Cell) formed from a solid electrolyte located between two electrodes based on the formation of dendrites within the solid electrolyte between two electrodes by raising these electrodes to appropriate potentials. The formation of dendrites provides a means of obtaining a given electrical conduction between two electrodes as soon as a dendritic conducting bridge is set up between the two electrodes. The potentials applied to each of the electrodes can be modified to alter the distribution and number of dendritic conducting bridges to modify electrical conduction between the two electrodes. Inverting the potential between the electrodes breaks the contact of the dendritic conducting bridges between the electrodes by partial dissolution of the bridges and eliminates or reduces electrical conduction.

The PMC cells thus operate in two states: first a so-called "ON" state and secondly a so-called "OFF" state, and act as memory cells. In PMC memory cells, the solid electrolyte may be based on chalcogenides such as GeSe conducting silver ions. This electrolyte is an ionic conductor and electronic insulator, and is usually placed between a silver-based electrode and an inert electrode, for example based on Nickel. No contact is set up in the initial state between the two electrodes that are separated by an insulator. When a bias voltage is applied between the two electrodes, the silver electrode produces Ag+ ions that pass through the electrolyte and are deposited on the opposite electrode, forming one or several metallic silver dendrites. When one or several dendrites pass through the entire thickness of the electrolyte and come into contact with the silver electrode facing them, a conducting bridge is set up and the memory changes to the conducting state. A PMC memory cell can pass very quickly from the conducting state to the insulating state. These two states correspond to memory "write" and "erase" actions.

As noted, PMC memories have disadvantages. After a certain number of write/erase cycles, silver-based dendrites form on the two electrodes facing each other simultaneously. A symmetric silver electrode/electrolyte/silver electrode system forms. This risks creating a path of conducting dendrites between the two electrodes, regardless of the sign of the imposed voltage (positive or negative). But maintaining the erase voltage that should create a break in the dendrite formed on one of the two electrodes, will actually cause formation of a dendrite (on the electrode opposite the first electrode) that will once again short circuit the two electrodes.

Furthermore, the growth of silver dendrites does not take place in a controlled manner. At the end of a certain number of erase/write cycles, the electrolytic medium between the two electrodes is saturated with isolated metallic aggregates, and it becomes impossible to control operation of the system: conducting bridges are set up and dissolved at random during write and erase steps, and the reliability of the device is reduced.

Neuromorphic systems also employ these memory devices. These Neuromorphic systems, also referred to as artificial neural networks, are computational systems that permit electronic systems to essentially function in a manner analogous to that of biological brains. Neuromorphic systems do not generally utilize a traditional digital model of manipulating 0s and 1s. Instead, neuromorphic systems create connections between processing elements that are roughly functionally equivalent to neurons of a biological brain. Neuromorphic systems include various electronic circuits in addition to these memory devices that model biological neurons.

A neuromorphic memory circuit may include a programmable resistive memory element, a conductive axon leaky integrate and fire (LIF) line configured to transmit an axon LIF pulse, and a conductive dendrite LIF line configured to build up a dendrite LIF charge over time. A first transistor is electrically coupled to the dendrite LIF line and the programmable resistive memory element. The first transistor provides a discharge path for the dendrite LIF charge through the programmable resistive memory element when the axon LIF line transmits the axon LIF pulse. A conductive axon spike timing dependent plasticity (STDP) line is configured to transmit an axon STDP pulse. The axon STDP pulse is longer than the axon LIF pulse. A conductive dendrite STDP line is configured to transmit a dendrite STDP pulse after voltage at the dendrite LIF line falls below a threshold voltage. A second transistor is electrically coupled to the axon STDP line and the programmable resistive memory element. The second transistor provides an electrical path for the dendrite STDP pulse through the programmable resistive memory element when the axon STDP line transmits the axon STDP pulse.

A neuromorphic memory circuit may also comprise a memory cell array. Each memory cell in the memory cell array includes a programmable resistive memory element, a conductive axon LIF line configured to transmit an axon LIF pulse, and a conductive dendrite LIF line configured to build up a dendrite LIF charge over time. The axon LIF line is electrically coupled to a column of memory cells in the memory cell array. The dendrite LIF line is electrically coupled to a row of memory cells in the memory cell array. A first transistor is electrically coupled to the dendrite LIF line and the programmable resistive memory element. The first transistor provides a discharge path for the dendrite LIF charge through the programmable resistive memory element when the axon LIF line transmits the axon LIF pulse. A conductive axon STDP line is configured to transmit an axon STOP pulse, and a conductive dendrite STDP line is configured to transmit a dendrite STDP pulse after the dendrite LIF charge falls below a threshold voltage. The axon STDP pulse is longer than the axon LIF pulse. Furthermore, the axon STDP line is electrically coupled to the column of memory cells in the memory cell array, and the dendrite STDP line is electrically coupled to the row of memory cells in the memory cell array. A second transistor is electrically coupled to the axon STDP line and the programmable resistive memory element. The second transistor provides an electrical path for the dendrite STDP pulse through the programmable resistive memory element when the axon STDP line transmits the axon STDP pulse.

IBM's 2014 TrueNorth neuromorphic CMOS integrated circuit (Merola, et al., *Science*. 345 (6197): 668. doi: 10.1126/science.1254642. PMID 25104385). comprises a manycore processor network on a chip design, with 4096 cores, each one simulating 256 programmable silicon "neurons" for a total of just over a million neurons. In turn, each neuron has 256 programmable "synapses" that convey the signals between them. Hence, the total number of programmable synapses is just over 268 million (http://spectrum.ieee.org/computing/hardware/how-ibm-got-brainlike-efficiency-from-the-truenorth-chip "How IBM Got Brainlike Efficiency From the TrueNorth Chip")
In terms of basic building blocks, its transistor count is 5.4 billion. Since memory, computation, and communication are handled in each of the 4096 neurosynaptic cores, TrueNorth circumvents the von-Neumann-architecture bottlenecks and is very energy-efficient, consuming 70 milliwatts and a power density that is 1/10,000th of conventional microprocessors. (*Cognitive computing: Neurosynaptic chips. IBM.* 11 December 201 News Release.). The SyNAPSE chip (introduced mid 2014) operates at lower temperatures and less power because it operates only when it needs, rather than all the time. Higher speed switching devices in these neuromorphic devices, however, would make them even more advantageous. The high speed thin film two terminal chargeable and dischargeable variable resistance battery provides this advantage, along with eliminating dendritic devices from these neuromorphic articles of manufacture, and provides other advantages that will become apparent from the disclosure of the present invention in this specification and the appended drawings.

As to thin film batteries, 3D integration of ail-solid-state rechargeable thin film Li-ion batteries comprise power sources used in many applications such as implantables, sensors and autonomous devices. Niessen, et al., U.S. Patent Application Publication 20100003600 uses these battery stacks as a fully tunable resistor by electrochemical insertion/deinsertion of active species in a host material to change the resistance in this battery stack. Niessen, et al. describe a solid-state variable resistor, comprising a first battery electrode layer deposited on a substrate, a solid electrolyte layer deposited on the first battery electrode layer, a second battery electrode layer deposited on the solid electrolyte layer and two resistor contacts being both in contact with one of the electrode layers. They form the resistor from the electrode material present between the two resistor contacts by creating a path between the contacts and varying the resistance in the path by electrically changing the concentration or the density of the active species in the storage material from which the electrode is formed. This path between the contacts lies in a plane parallel to the planes of two electrodes that sandwich the path.

Niessen, et al., (par. [0050]) however, notes "that changing the resistance in the device [i.e., the Niessen et al. battery] is not as fast as in a MOSFET due to the fact that active species have to be introduced or removed from an active layer by means of electrochemical reactions. This requires a certain amount of time."

The present invention overcomes some of the foregoing difficulties by providing a high speed electrochemical memory cell device or battery that does not have some of the disadvantages mentioned above, and further provides more sensitive electrochemical memories based on the variation of conductivity of the electrodes.

RELATED ART

The following United States published patent applications provide examples of the state of the art of devices and processes related to the articles of manufacture and processes of the present invention:

Niessen, et al., US 20100003600, Solid-State Structure Comprising a Battery and a Variable Resistor of Which The Resistance is Controlled by Variation of the Concentration of Active Species in Electrodes of the Battery Bloch, US 20080043515, Electrochemical Memory Device Krieger, et al., U.S. Pat. No. 6,864,522 describes a memory device having two collecting electrodes and a stack of layers including at least one active layer which electrical conductivity varies by applying a potential difference between the two electrodes.

SUMMARY OF THE INVENTION

The present invention comprises structures, articles of manufacture, processes and products produced by the processes that address the foregoing needs, and provides not only articles of manufacture based on chargeable and dischargeable variable resistance thin film two terminal batteries having substantially improved performance, but also high speed memory processes using these articles of manufacture and products produced by these processes.

In one embodiment the invention comprise a battery article of manufacture comprising layers operatively associated with one another. By "operatively associated" with one another we mean electrical conductivity between the layers, i.e., layers having interconnecting electrical pathways that allow an electrical current to pass form one layer to another, or layers joined to one another in a manner to pass an electrical current from one layer to another. One of these layers comprises barrier means interposed between at least one battery electrode and the battery electrolyte to substantially prevent ions in the electrolyte from reacting with the electrode, where the overall structure of the battery and the chemical composition of the battery components allow the movement of electrolyte ions from one electrode toward another electrode in the battery during electrical charge and discharge cycles. The electrical charge and discharge cycles can function to provide write-erase configurations of the battery in a computer circuit.

In another embodiment we provide a battery article of manufacture comprising a plurality of components operatively associated with one another, the plurality of components comprising at least one first electrode and at least one second electrode, the first electrode and the second electrode selected from at least one cathode and at least one anode, the cathode and the anode each comprised of a material that can take up ions and discharge ions in a charging and discharging process, an electrolyte between the electrodes, the ionic electrolyte comprising the ions, the article of manufacture also including a component comprising at least one barrier component positioned between the electrolyte and at least one of the electrodes, the barrier component comprised of a material that substantially prevents the ions from combining with at least one of the electrodes and having a structure that substantially prevents the ions from combining with at least one of the electrodes, but allows the ions to travel toward or away from one electrode to the other electrode in charging or discharging process.

In another embodiment of the invention we provide a high speed thin film two terminal resistive memory article of manufacture comprising a chargeable and dischargeable variable resistance thin film battery that comprises a plurality of layers operatively associated with one another. In one embodiment, the plurality of layers comprise in sequence, a cathode-side conductive layer, a cathode layer comprised of a material that can take up cations and discharge cations in a charging and discharging process, an electrolyte layer comprising the cations, a barrier layer, an anode layer, and an optional anode-side conductive layer, the barrier layer comprised of a material that substantially prevents the cations from combining with the anode layer. The optional anode-side conductive layer may comprise a semiconductor device.

In a further embodiment we provide a computing process comprising applying a write-erase cycle to a battery article of manufacture operatively associated with a computer circuit where the write-erase cycle comprises applying a voltage controlled current source write signal to the battery in order to charge the battery, and subsequently erasing the signal by discharging the battery, where the battery comprises a plurality of components operatively associated with one another, the plurality of components comprising an electrode comprised of a material that can attract ions and repel ions in a charging and discharging process, an electrolyte operatively associated with the electrode, the electrolyte comprised of the ions, the article of manufacture also including a component comprising at least one barrier component positioned between the electrolyte and the electrode, the barrier component comprised of a material and having a structure that substantially prevents the cations from combining with the electrode, but allows the ions to travel toward or away from the electrode in the charge or discharging write-erase cycle.

BRIEF DESCRIPTION OF THE DRAWINGS

The accompanying drawings are not necessarily drawn to scale but nonetheless set out the invention, and are included to illustrate various embodiments of the invention, and together with this specification also serve to explain the principles of the invention. These drawings comprise various Figures that illustrate the structure and properties of high speed thin film two terminal resistivity memory articles of manufacture of the invention based on chargeable and dischargeable variable resistance thin film batteries and a high speed memory process using these articles of manufacture.

FIG. 2A comprises a graph plotting cell resistance as the ordinate, and time in seconds as the absisca when charging the cell of FIG. 1A, and FIG. 2B comprises a graph plotting cell resistance as the ordinate and time in seconds as the absisca when discharging the cell of FIG. 1A.

FIG. 7 comprises a graph of the pulse scheme operation of the device of FIG. 1A.

DETAILED DESCRIPTION OF THE INVENTION

Figure 1A:
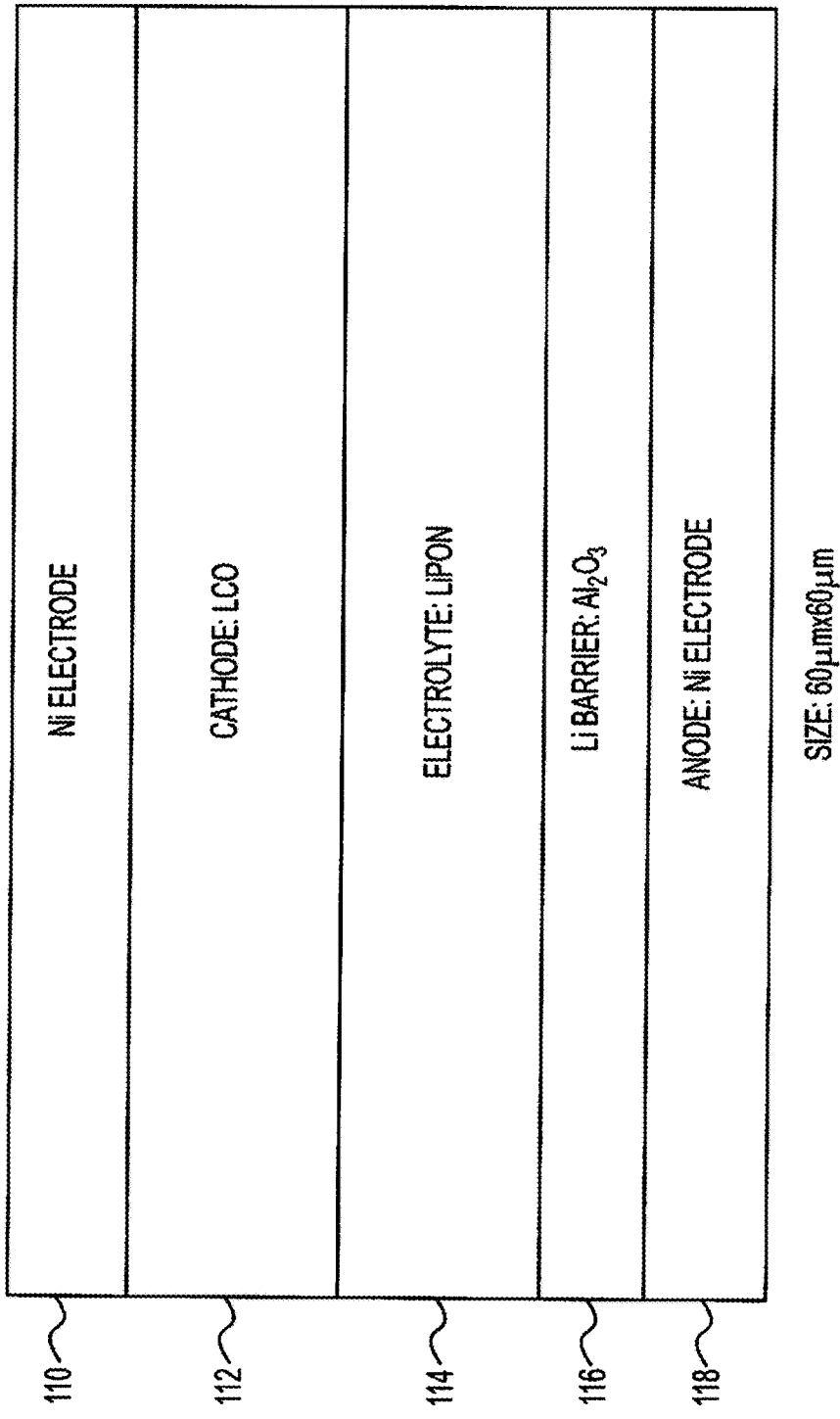
FIG. 1A comprises a side elevation in cross-section illustrating a measured variable resistance thin film battery structure of the invention and FIG. 1B, a photomicrograph of a structure of this type.

To achieve the foregoing and other advantages, and in accordance with the purpose of this invention as embodied and broadly described herein, the following detailed description comprises disclosed examples of the invention that can be embodied in various forms.

The specific processes, compounds, compositions, and structural details set out herein not only comprise a basis for the claims and a basis for teaching one skilled in the art to employ the present invention in any novel and useful way, but also provide a description of how to make and use this invention. Not only do the written description, claims, abstract of the disclosure, and the drawings that follow set forth various features, objectives, and advantages of the invention and how they may be realized and obtained, but these features, objectives, and advantages will also become apparent by practicing the invention.

One embodiment of the invention comprises a high speed thin film two terminal resistive memory article of manufacture comprising a chargeable and dischargeable variable resistance thin film battery that comprises a plurality of layers operatively associated with one another. Thin film layers vary in thickness, for example, and referring to FIG. 1 layer 110, from about 50 nm to about 200 nm, where layer 112 is about 20 nm to about 200 nm, layer 114 is about 10 nm about 200 nm, layer 116 is The battery comprises barrier means interposed between at least one battery electrode and the battery electrolyte to substantially prevent ions in the electrolyte from reacting with the electrode, where the overall structure of the battery and the chemical composition of the battery components allow the movement of electrolyte ions from one electrode toward another electrode in the battery during electrical charge and discharge cycles. The electrical charge and discharge cycles can function to provide write-erase configurations of the battery in a computer circuit. The invention also comprises a product produced by the process of charging and discharging the article to create these write-erase cycles.

The plurality of layers may comprise in sequence, a cathode-side conductive metal electrode layer, a cathode layer comprised of a material that can take up cations and discharge cations in a charging and discharging process, an electrolyte layer comprising the cations, a barrier layer, an anode layer, and an optional anode-side conductive layer, the barrier layer comprised of a material that substantially prevents the cations from combining with the anode layer. The optional anode-side conductive layer may comprise a semiconductor device.

The battery may comprise as a cathode-side conductive metal electrode layer a metal such as Ni, a cathode layer such as LCO that can take up and discharge Li cations in a charging and discharging process, an electrolyte layer comprising alkali metal cations viz the Group !A metals Li, Na, K, Rb, Cs, and Fr, such as Li, e.g., UPON, a barrier layer comprised of a Group IIIA element—oxide or combinations of Group IIIA—oxides such as an aluminum oxide, an anode layer comprising a conductive metal such as Ni, and optionally a semiconductor layer, the oxide barrier layer selected to substantially prevent alkali metal cations such as Li from combining with the anode layer.

Although the cathode-side conductive layer may comprise Ni, an equivalent cathode-side conductive layer may be used such as Al, Pt, Au, Ag, Cu, Ta, Ti, TaN, and TiN. Platinum, for example, may be selected for deposition during manufacturing processes that expose the conductive layer to oxidation, since Pt is not prone to oxidation during the deposition.

The cathode layer may also comprises a layer that can take up and discharge cations such as lithium cations, e.g., LiCO ($LiCoO_2$) and similar materials. LICO cathodes have very stable capacities, but have lower capacities and power than cathodes based on materials like nickel-cobalt-aluminum (NCA) oxides, $LiNiCoAlO_2$, but we can use NCA oxides as cathodes as well, in addition to nickel-rich cathode materials known in the art. Other cathodic materials for use in the invention comprise $LiCo_{1-y}B_yO_2$, e.g., $Li_{0.999}Co_{1-y}B_yO_2$ ($0.05 \leq y \leq 0.35$), Li/$LiCo_{0.75}B_{0.25}O_2$, Li/Li+/Lix-$Co_yMn_2$-yO4, Olivine ($LiCo_{1/3}Mn_{1/3}Ni_{1/3}PO_4$), layered $LiCo_{1-x}Mg_xO_2$ (x=0.0, 0.1, 0.2, 0.3 and 0.5) oxide, LiCo 0.8M 0.2O 2 (M=Mg, Ca, Ba), LiCo0.4Al0.1Mn1.5O4, LiCo1xFexPO4 (x=0.00, 0.25, 0.50, 0.75, 1.00), $LiMn_2O_4$, $LiCo_{0.55}Ni_{0.4}Ti_{0.05}O_2$ $LiCo_{0.55}Ni_{0.4}Fe_{0.05}O_2$, LiCo 1-y Ni y O 2 LiMn 2 O 4, Lithium nickel cobalt oxide (LNCO) described in United States Patent Application 20110250508, lithium nickel manganese cobalt oxide $LiNi_xMn_yCo_zO_2$ (LNMCO), described in United States Patent Application 20110250508, (LMO) $LiMn_2O_4$, (LFP) $LiFePO_4$), and the like, and combinations of any of the foregoing cathode layer materials.

The electrolyte layer comprising cations may comprise an ionic conducting and electronic insulating material, such as "Lipon®" type glass with the composition $IB_2O$, $-0.8Li_2O-0.8Li_2SO_4$. We select the thickness of the Lipon layer to be resistant to the passage of electrons, but, sufficiently weak so that it does not create any excessive resistance to the passage of ions, e.g., from about 10 nanometers to about 200 nanometers, or in the order of about 100 nanometers. We base the foregoing electrolyte layer comprising cations on a Li type glass, however, we also employ Li compounds for the electrolyte, such as $Li_xV_2O_5$, $L_{ix}$, $WO_3$, $Li_xSi$, $Li_xBi$, or $Li_xSb$ and combinations thereof. These Li compounds and combinations thereof provide a large difference in resistance with a limited variation of concentration, and therefore good control of the resistance with an input signal requiring only limited power.

Instead of the foregoing electrolyte layer comprising Li glass or Li compounds, we can use other cationic compounds as electrolytes, e.g., compounds with hydrogen as the cation (hydrogen compounds), such as Mg-based hydrides, that include compounds such as $H_xMg_yM_{(1-y)}$, with M=Sc, Ti, V, Cr, Gd, Sm, Y; $H_xMg_2Ni$ or $H_xRE$, with RE=Rare Earths, and combinations thereof.

These hydrogen compounds and combinations thereof, as with the Li compounds and combinations thereof, provide large differences in resistance with a limited variation of concentration, and therefore to good control of the resistance with an input signal requiring only limited power.

The barrier layer may be comprised of a Group IIIA element of the Periodic Table of the Elements (i.e., B, Al, Ga, In, and TI) such as a Group IIIA—oxide or combinations of Group IIIA—oxides such as aluminum oxide, or aluminum oxides. We can use other layers such as materials selected from a Group IVB element of the Periodic Table of the Elements, (i.e., Ti, Zr, and Hf) or a Group VB element of the Periodic Table of the Elements, (i.e., V, Nb, and, and Ha), compounds thereof such as nitrides or oxides thereof and combinations thereof. Some Group VB materials include, e.g., Ta, TaN, Ti, and TiN. We also can use combinations of the foregoing elements We select the barrier layer to substantially preclude diffusion of electrolyte cations into the electrode, e.g. the anode as a result of which the thin film two terminal resistive memory article of manufacture of the invention operates at higher speeds than the article would if it didn't have the barrier layer.

In one embodiment the anode comprises an electrically conductive metal such as Ni, which combines with the electrolyte cations in an intercalation process in the absence of the barrier. We also use other art-known electrically conductive metal anodes, especially those used in lithium batteries as well as compounds such as (LTO) $Li_4Ti_5O_{12}$ hard carbon, silicon, tin/cobalt alloy, silicon/carbon, and combinations thereof.

Although we do not wish to be bound by any theory, it appears that by preventing the electrolyte cation from combining with the electrode (e.g., anode), we by-pass the step of dislodging the cation from the anode in the charge or write cycle of the invention where the cation gets combined with the electrode (e.g., cathode) that previously discharged the cation in the erase cycle. This by-passing of the step of dislodging the cation from the electrode (e.g., anode) speeds up the write-erase cycle which Niessen US APP. 20100003600 par. [0050] confirms in noting: "changing the resistance in the [battery] device disclosed . . . is not as fast as in a MOSFET due to the fact that active species [cations] have to be introduced or removed from an active layer [e.g., anode] by means of electrochemical reactions. This requires a certain amount of time."

In use, we charge the battery of the invention to substantially combine the cathode with the electrolyte cation, e.g., lithium, and thereby convert the battery to a write configuration. We then cycle the battery through a discharge process to substantially remove the electrolyte cation from the cathode, (de-lithiation when employing lithium as the electrolyte cation) to process the article into an erase configuration. By repeating this charging and discharging process we produce a write-erase cycle that we convert to computer memory in an art-known way.

Figure 1B:
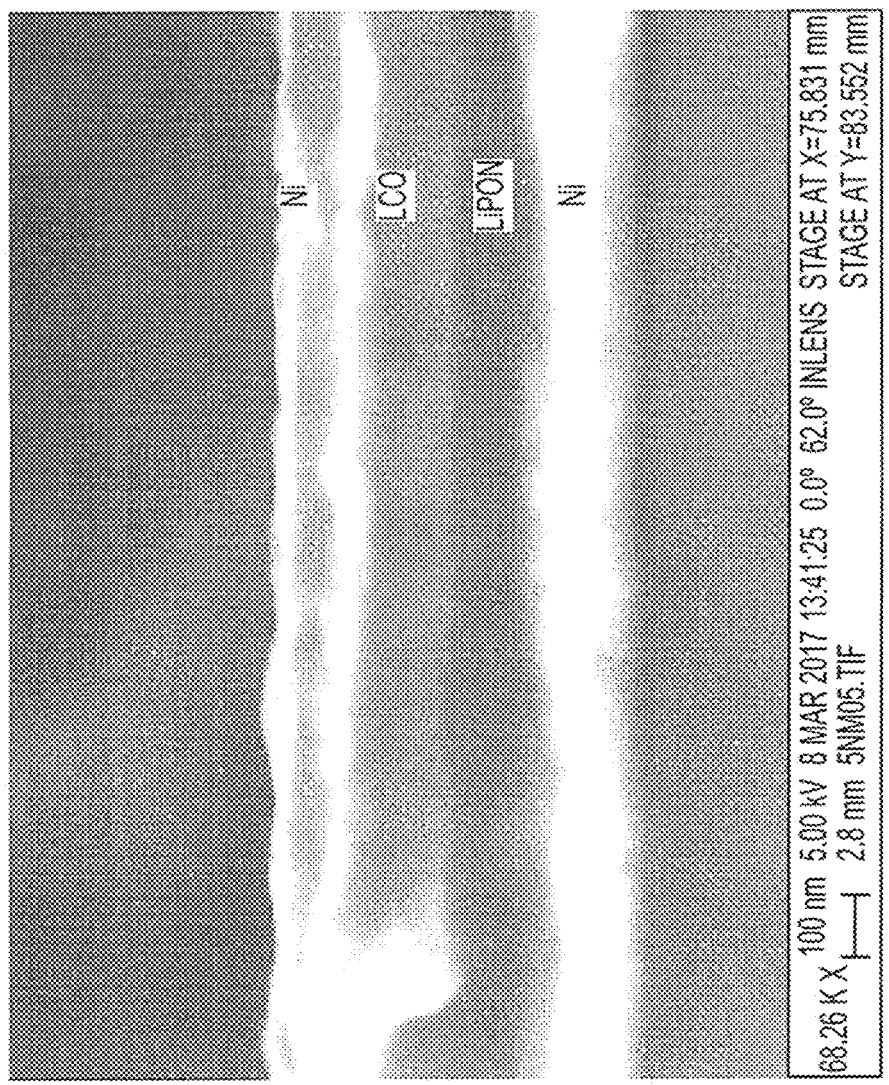
Figure 3:
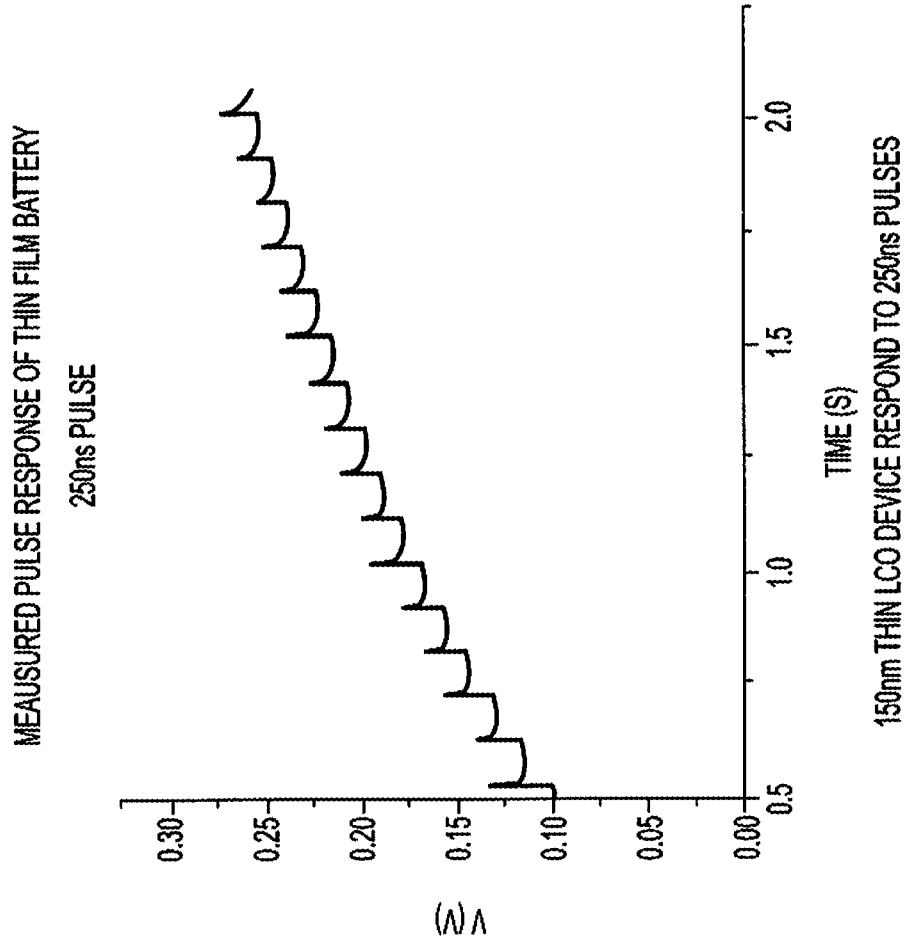
FIG. 3 comprises a graph plotting measured pulse response of a thin film battery such as that illustrated in FIG. 1A with voltage as the ordinate, and time in seconds as the absisca using a 250 nanosecond (ns) pulse.

Referring to FIG. 1A, the foregoing high speed thin film two terminal resistive memory article of manufacture comprises a chargeable and dischargeable variable resistance thin film battery 100 comprises a plurality of layers operatively associated with one another (as defined above), the plurality of layers comprising in sequence, a cathode-side conductive Ni metal electrode layer 110, an LCO cathode layer 112 that can take up and discharge alkali metal cations in a charging and discharging process, a LIPON electrolyte layer 114 comprising Li cations, a barrier layer 116 comprising a Group IIIA—oxide or combinations of Group IIIA—oxides such as an aluminum oxide, an anode layer 118 comprising a conductive Ni metal electrode, and optionally a semiconductor layer (not shown) operatively associated with anode layer 118, the barrier layer 116 selected to substantially prevent the cations from combining with the anode layer 118. FIG. 1B comprises a photomicrograph of the thin film battery 100 article depicted in FIG. 1A.

Figure 4:
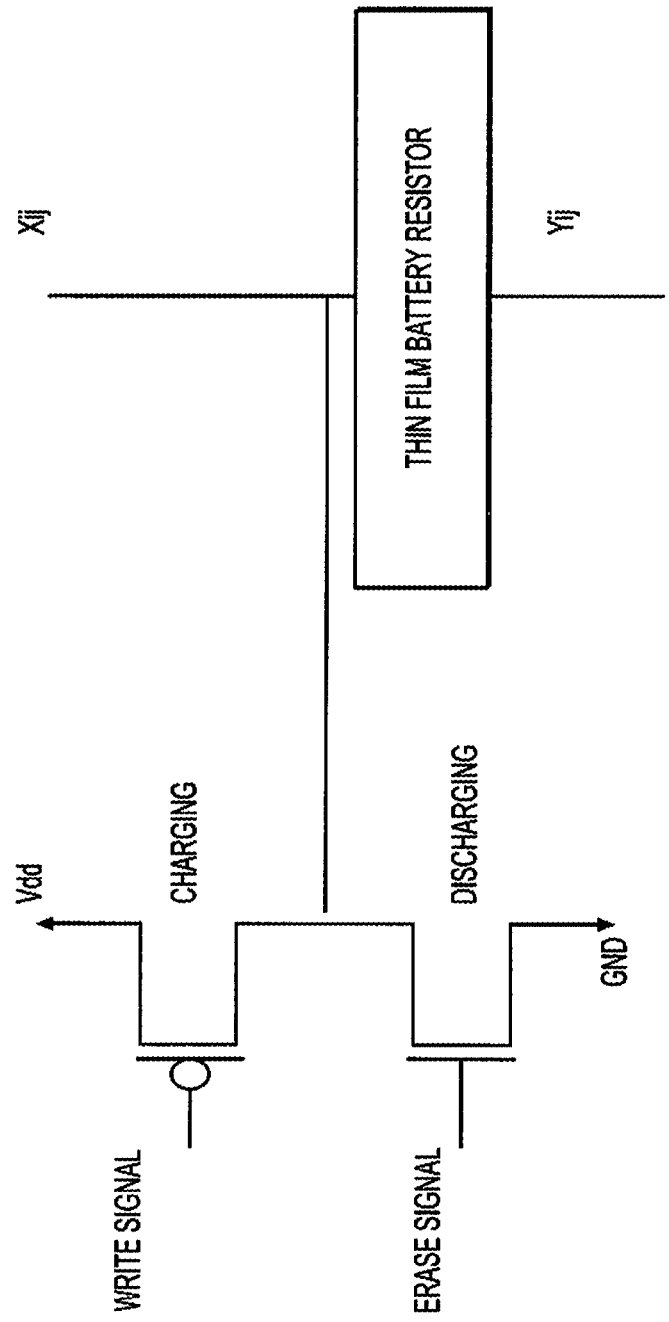
FIG. 4 comprises a schematic drawing illustrating a disclosed synapse structure using voltage controlled current source to charge and discharge the battery illustrated in FIG. 1A.

FIG. 2A and FIG. 2B illustrate significant features of the thin cell battery of the present invention in that we can modify resistance of the battery by controlling the time of charging and discharging in the write-erase cycle. FIG. 2A illustrates resistance change in the battery of FIG. 1A when we apply a charge of about 4 volts and about 2E-9 amps to the device of FIG. 1A over a period of time of up to about 150 seconds which we plot as the abscissa, illustrating how we can change resistance by the way we apply current to the device in the write process. Similarly FIG. 2B illustrates how we can control resistance of the device in the discharge or erase process by discharging the device over a period of time, again illustrated by the abscissa in FIG. 2B. The symmetry in the up/down sweep signifies we can operate the battery through the write-erase cycle without having to account for differences between the two processes, making it more suitable for use as a computer memory device. Stated otherwise the battery of the present invention substantially minimizes or substantially eliminates hysteresis during its operation in a write-erase cycle. We can also modify resistance to a desired value by changing the thickness and the size of the battery In FIG. 4, "Vdd" denotes Power Supply voltage, "GND" "ground," "Xij" input for column i row j, "Yij" output for column i row j.

Figure 5B:
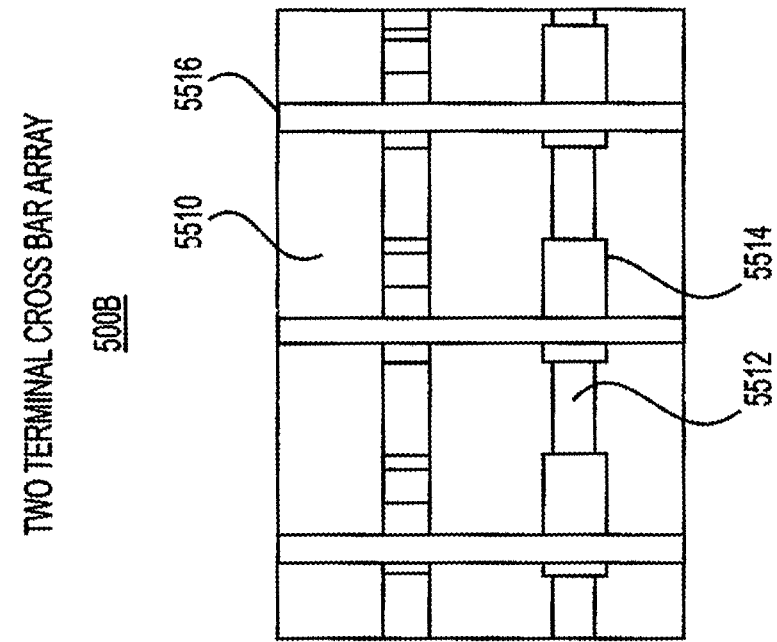
FIG. 5A comprises a side elevation in cross-section illustrating the variable resistance thin film battery structure of FIG. 1A operatively associated with a semiconductor, and FIG. 5B, a plan view of the FIG. 5 A variable resistance thin film battery structure of FIG. 1A operatively associated with a semiconductor FIG. 6 comprises a chart of the dielectric relaxation time of the device of FIG. 1A.
Figure 5A:
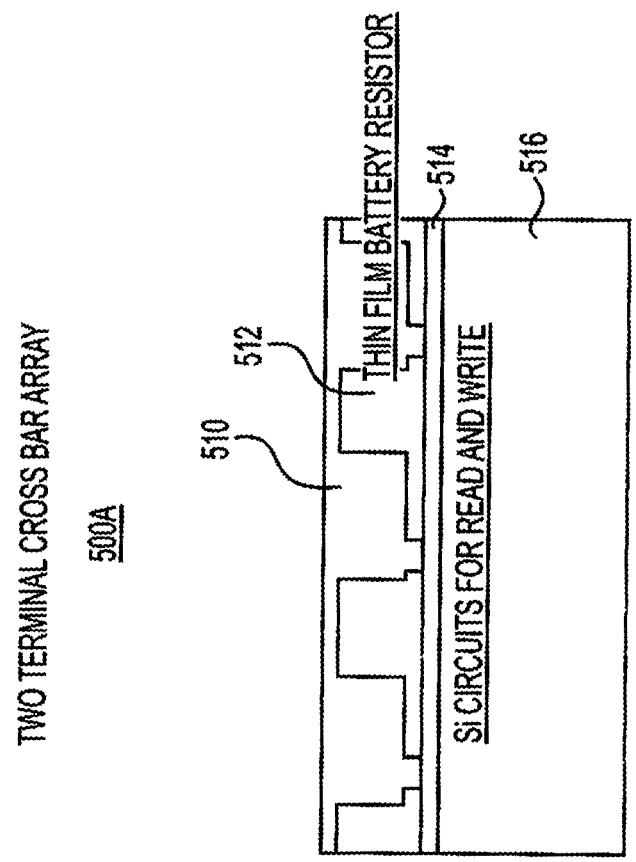

FIG. 5A comprises a side elevation in cross section 500A of the thin film battery of the invention with elements 510 comprising a metal, 512 a dielectric, 514 Si transistor circuits, 516 a substrate, and FIG. 5B comprising a plan view 500B of the thin film battery illustrated in FIG. 500A, where 5510 comprises a dielectric, 5512 a metal, 5514 a metal under a dielectric, and 5516 a device under a dielectric.

In use, the article of manufacture of the invention, i.e., the battery or batteries of the present invention (e.g., those of FIG. 1A) is/are operatively associated with a computing circuit such as a variable resistance computing circuit, e.g., a neuromorphic computing circuit, or a memristor computing circuit. By way of example, the article of manufacture of the invention, i.e., the battery or batteries of the present invention (e.g., those of FIG. 1A) can be used in place of the variable resistance devices employed in and operatively associated with known computer circuits, such as the variable resistance devices employed in the neuromorphic circuit specification and drawings of the Breitwisch, et al. U.S. Pat. Nos. 8,589,320 and 8,311,965 described as "variable resistance material"; the Friedman, et al. U.S. Pat. No. 9,269,042 described as "variable state resistor"; the Gotsmann, et al. U.S. Pat. No. 9,547,819 described as "programmable analog or multilevel resistor"; the Kim, et al. U.S. Pat. Nos. 9,830,981 and 9,830,982 described as "programmable resistive memory element"; the Leobandung U.S. Pat. No. 9,779,355 described as "memristor"; the Boybat Kara, et al. U.S. Pat. No. 9,767,408 described as "multi-memristive synaptic element"; and the Boybat Kara, et al. U.S. Pat. No. 9,785,885 described as "memristor."

Additionally, the article of manufacture of the invention, i.e., the battery or batteries of the present invention (e.g., those of FIG. 1A) can be used substantially in place of the variable resistance devices employed in and operatively associated with other known devices such as computer circuits, e.g., memristor variable resistance devices including those employed in the memristor computer circuit specification and drawings of Abali, et al. U.S. Pat. Nos. 9,195,614 and 9,158,712 and Abali, et al. U.S. Patent Applications 20140195721 and 20140195719.

The present invention also comprises computing processes comprising applying a write-erase cycle to the article of manufacture of the invention, i.e., the battery or batteries of the present invention (e.g., those of FIG. 1A) used, as noted herein, in place of the variable resistance devices operatively associate with and employed in neuromorphic circuits employing variable resistance devices described in the specification and drawings of the Breitwisch, et al. U.S. Pat. Nos. 8,589,320 and 8,311,965, Friedman, et al. U.S. Pat. No. 9,269,042, Gotsmann, et al. U.S. Pat. No. 9,547,819, Kim, et al. U.S. Pat. Nos. 9,830,981 and 9,830,982, Leobandung U.S. Pat. No. 9,779,355, Boybat Kara, et al. U.S. Pat. No. 9,767,408, and Boybat Kara, et al. U.S. Pat. No. 9,785,885, and the computer circuits employing memristor variable resistance devices operatively associated with and described in the specification and drawings of Abali, et al. U.S. Pat. Nos. 9,195,614 and 9,158,712 and Abali, et al. U.S. Patent Applications 20140195721 and 20140195719. In these processes the write-erase cycle comprises applying a voltage controlled current source write signal to the battery in order to charge the battery, and subsequently erasing the signal by discharging the battery. This invention also comprises a product made by any one of the foregoing processes.

Throughout this specification, and abstract of the disclosure, the inventors have set out equivalents, of various materials as well as combinations of elements, materials, compounds, compositions, conditions, processes, structures and the like, and even though set out individually, also include combinations of these equivalents such as the two component, three component, or four component combinations, or more as well as combinations of such equivalent elements, materials, compositions conditions, processes, structures and the like in any ratios or in any manner. When we use the term "combination(s)" referring to metals or elements, we mean mixtures, alloys, intercalations and compositions of matter that include these metals and/or elements.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as used in any part of the specification, e.g., any parameters herein, such as a numerical value, including values used to describe numerical ranges, means slight variations in the parameter. In another embodiment, the terms "about," "substantial," or "substantially," when employed to define a numerical parameter include, e.g., a variation up to five per-cent, ten per-cent, or 15 per-cent, or somewhat higher.

All scientific journal articles and other articles, including internet sites, as well as issued and pending patents that this written description or applicants' Invention Disclosure Statements mention, including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the references cited therein, as all or any one may bear on or apply in whole or in part, not only to the foregoing written description, but also the following claims, and abstract of the disclosure.

Although the inventors have described their invention by reference to some embodiments, other embodiments defined by the doctrine of equivalents are intended to be included as falling within the broad scope and spirit of the foregoing written description, the claims, abstract of the disclosure, and drawings.

We claim:

1. A battery-based resistive memory article of manufacture comprising a plurality of components operatively associated with one another, said plurality of components comprising an electrode comprised of a material that can take up ions and discharge ions in a charging and discharging process, an electrolyte comprised of said ions, said article of manufacture also including a component comprising at least one barrier positioned between said electrolyte and said electrode, said barrier comprised of a material that substantially prevents said ions from combining with said electrode and having a structure that substantially prevents said ions from combining with said electrode, but allows said ions to travel toward or away from said electrode in said charging or discharging process, a location of said ions indicating a data value stored by said battery-based resistive memory article of manufacture.

2. A battery-based resistive memory article of manufacture comprising a plurality of components operatively associated with one another, said plurality of components comprising at least one first electrode and at least one second electrode, said first electrode and said second electrode selected from at least one cathode and at least one anode, said cathode and said anode each comprised of a material that can take up ions and discharge ions in a charging and discharging process, an electrolyte between said electrodes, said electrolyte comprised of said ions, said article of manufacture also including a component comprising at least one barrier positioned between said electrolyte and at least one of said electrodes, said barrier comprised of a material that substantially prevents said ions from combining with at least one of said electrodes and having a structure that substantially prevents said ions from combining with at least one of said electrodes, but allows said ions to travel toward or away from one said electrode to the other said electrode in said charging or discharging process, a location of said ions indicating a data value stored by said battery-based resistive memory article of manufacture.

3. The article of manufacture of claim 1 wherein each ion is comprised of an alkali metal cation.

4. The article of manufacture of claim 2 wherein each ion is comprised of an alkali metal cation.

5. The article of manufacture of claim 1 wherein said electrode comprises an LCO cathode.

6. The article of manufacture of claim 2 wherein said electrode comprises an LCO cathode.

7. The article of manufacture of claim 1 wherein said barrier is comprised of a Group IIIA element.

8. The article of manufacture of claim 1 wherein said barrier is comprised of aluminum.

9. The article of manufacture of claim 2 wherein said barrier is comprised of a Group IIIA element.

10. The article of manufacture of claim 2 wherein said barrier is comprised of aluminum.

11. The article of manufacture of claim 1 wherein said barrier is comprised of a Group IVB element.

12. The article of manufacture of claim 1 wherein said barrier is comprised of a Group VB element.

13. The article of manufacture of claim 2 wherein said barrier is comprised of a Group IVB element.

14. The article of manufacture of claim 2 wherein said barrier is comprised of a Group VB element.

15. The article of manufacture of claim 1 configured to comprise a chargeable and dischargeable variable resistance high speed thin film two terminal resistive battery memory.

16. The article of manufacture of claim 1 configured to comprise a chargeable and dischargeable variable resistance high speed thin film two terminal resistive battery memory operatively associated with a computing circuit.

17. The article of manufacture of claim 1 configured to comprise a chargeable and dischargeable variable resistance high speed thin film two terminal resistive battery memory operatively associated with a variable resistance computing circuit.

18. The article of manufacture of claim 1 configured to comprise a chargeable and dischargeable variable resistance high speed thin film two terminal resistive battery memory operatively associated with a neuromorphic computing circuit.

19. The article of manufacture of claim 1 configured to comprise a chargeable and dischargeable variable resistance high speed thin film two terminal resistive battery memory operatively associated with a memristor computing circuit.

20. The article of manufacture of claim 2 configured to comprise a chargeable and dischargeable variable resistance high speed thin film two terminal resistive battery memory.

21. The article of manufacture of claim 2 configured to comprise a chargeable and dischargeable variable resistance high speed thin film two terminal resistive battery memory operatively associated with a computing circuit.

22. The article of manufacture of claim 2 configured to comprise a chargeable and dischargeable variable resistance high speed thin film two terminal resistive battery memory operatively associated with a variable resistance computing circuit.

23. The article of manufacture of claim 2 configured to comprise a chargeable and dischargeable variable resistance high speed thin film two terminal resistive battery memory operatively associated with a neuromorphic computing circuit.

24. The article of manufacture of claim 2 configured to comprise a chargeable and dischargeable variable resistance high speed thin film two terminal resistive battery memory operatively associated with a memristor computing circuit.

25. The article of manufacture of claim 1, wherein a movement of said ions from one of said electrodes toward another of said electrodes occurs during said charging process and said discharging process, wherein said charging and discharging processes function to provide write-erase configurations of the battery-based resistive memory article of manufacture, and wherein said article of manufacture is configurable to operate in an array of a plurality of battery-based resistive memory devices.

* * * * *